(12) United States Patent
Tung

(10) Patent No.: US 7,648,804 B2
(45) Date of Patent: Jan. 19, 2010

(54) MASK AND FABRICATION METHOD THEREOF AND APPLICATION THEREOF

(75) Inventor: Chun-Hao Tung, Taoyuan (TW)

(73) Assignee: Au Optronics Corp., Hsinchu (TW)

( * ) Notice: Subject to any disclaimer, the term of this patent is extended or adjusted under 35 U.S.C. 154(b) by 579 days.

(21) Appl. No.: 11/413,735

(22) Filed: Apr. 28, 2006

(65) Prior Publication Data

US 2007/0154816 A1 Jul. 5, 2007

(30) Foreign Application Priority Data

Dec. 30, 2005 (TW) .............................. 94147541 A

(51) Int. Cl.
*G03F 1/00* (2006.01)
(52) U.S. Cl. .......................................... 430/5; 430/311
(58) Field of Classification Search ...................... 430/5, 430/311
See application file for complete search history.

(56) References Cited

U.S. PATENT DOCUMENTS

| 5,418,095 | A | 5/1995 | Vasudev et al. ................ 430/5 |
| 5,482,799 | A | 1/1996 | Isao et al. ..................... 430/5 |
| 5,792,578 | A * | 8/1998 | Tzu et al. ...................... 430/5 |
| 2002/0039690 | A1 | 4/2002 | Inazuki et al. ................. 430/5 |
| 2003/0219654 | A1* | 11/2003 | Ushida et al. ................. 430/5 |
| 2006/0003266 | A1* | 1/2006 | Yi et al. ..................... 430/320 |

FOREIGN PATENT DOCUMENTS

| CN | 1577084 | 2/2005 |
| CN | 1204597 | 6/2005 |
| JP | 2000-010255 | 1/2000 |
| JP | 2000-027798 | 1/2000 |

* cited by examiner

*Primary Examiner*—Mark F Huff
*Assistant Examiner*—Rashid Alam
(74) *Attorney, Agent, or Firm*—J.C. Patents

(57) ABSTRACT

A mask including a transparent substrate, a semi-transparent layer and a film layer is provided. The transparent substrate at least has a first region, a second region and a third region. The semi-transparent layer covers the second region and the third region of the transparent substrate and exposes the first region. The film layer covers the halftone layer disposed at the third region, to make the transmittance of the third region lower than that of the second region. The halftone layer and the film can be made of phase shift layers, to form a phase shift mask. Besides, several fabrication methods of the mask are also disclosed to form the above-mentioned mask.

16 Claims, 12 Drawing Sheets

MASK AND FABRICATION METHOD THEREOF AND APPLICATION THEREOF

CROSS-REFERENCE TO RELATED APPLICATION

This application claims the priority benefit of Taiwan application serial no. 94147541, filed on Dec. 30, 2005. All disclosure of the Taiwan application is incorporated herein by reference.

BACKGROUND OF THE INVENTION

1. Field of Invention

The present invention relates to a mask and fabrication method thereof and its application. More particularly, the present invention relates to a phase shift mask, PSM as well as its fabrication method and application.

2. Description of Related Art

The fabrication method of the conventional mask includes first providing a quartz substrate and a metal layer is formed on the quartz substrate. After then, a photoresist layer is formed over the quarts substrate and the metal layer. By performing light exposure and developing at the specific region, a portion of the photoresist layer is removed, so as to expose a portion of the metal layer, corresponding to the removed portion of the photoresist layer. Then, the exposed portion of the metal layer is removed by a dry etching process or a wet etching process. After the photoresist layer is completely removed, a light shielding pattern and a light transparent pattern are formed on the quartz substrate. A transparent pellicle layer is formed over. Then, a binary mask is accomplished.

Even though the binary mask is widely used in semiconductor fabrication, due to the disadvantage of poor precision for this mask, the precision of the photoresist pattern, which is formed by using the binary mask for light exposure, is affected. In order to solve this disadvantage, a phase shift mask is then proposed.

The conventional phase shift mask is formed by the similar fabrication processes for the binary mask. First, a binary mask is preliminarily accomplished. Then, a phase shift layer is formed over the binary mask. A photoresist layer is formed over the binary mask and the phase shift layer. After performing light exposure and developing at the specific region, a portion of the photoresist layer is removed for exposing the phase shift layer at the portion, corresponding to the removed portion of the photoresist layer. Then, the exposed portion of the phase shift layer is removed by a dry etching process or a wet etching process. After removing the photoresist layer, a transparent pellicle layer is formed over mask. The phase shift mask is accomplished. It should be noted that the material for the conventional phase shift layer is highly transparent material, such as quartz. Therefore, the only different between the light passing the phase shift layer and the light without passing the phase shift layer is the phase difference. The light intensity has no apparent difference.

Although the phase shift mask can solve the issue of poor resolution, however, due to the fabrication process including the etching process, the etching process has non-uniform etching on the phase shift layer, resulting in the non-uniform thickness for the phase shift layer on the mask. After the light passes the phase shift layer at the different positions of the mask, the transmittance or the phase angle may be different, resulting in poor yield for the photolithographic process.

In addition, the fabrication for the phase shift mask is further forming a phase shift layer over the mask after the binary mask is preliminarily accomplished. The phase shift layer is defined by the photolithographic process and then the pattern is transferred to the phase shift layer by the etching process. The photoresist layer is then completely removed. Comparing with the conventional binary mask, since it has more fabrication processes, the probability for defects occurring on fabricating the mask is increasing. This would cause the higher cost for fabricating the mask.

SUMMARY OF THE INVENTION

The invention provides mask, which has better uniformity of light transmittance and phase angle.

The invention provides a fabrication method for the mask, in which a lift-off process is used to accomplish the fabrication of phase shift layer, so that the conventional issue of non-uniform thickness of the layer caused by the etching process for defining the phase shift layer can be prevented.

The invention provides a fabrication method for the mask, so as to reduce the fabrication cost for the phase shift mask.

The invention provides a fabrication method for the mask, in which the mask can be used for light exposure and developing on the photoresist layer, and is quite helpful for improving the precision on defining the photoresist pattern, so that yield of the halftone process and the fabrication tolerance can be improved.

The invention provides a fabrication process for a liquid crystal display apparatus, which uses the foregoing mask in processing.

For the foregoing or other objectives, the invention provides a mask, including a transparent substrate, a semi-transparent layer and a film layer. The transparent substrate at least includes a first region, a second region and a third region. The semi-transparent is covering over the second region and the third region of the transparent substrate. The film layer is located on the semi-transparent layer at the third region. As a result, the transmittance at the third region is less than the transmittance at the second region.

In an embodiment of the invention, the film layer and the semi-transparent layer can be a phase shift film and material for the phase shift film can be metal silicide, metal oxide, metal fluoride, metal silicide oxide, metal silicide nitride, metal silicide oxynitride, metal silicide carbide oxide, metal silicide carbide nitride, metal silicide carbide oxynitride, alloy thin film, metal thin film, carbide, carbide oxynitride, or any combination thereof.

In an embodiment of the invention, the film layer can be a light shielding film. The light shielding film can be a black metal film or a black resin film. Further, the black metal film can be chromium, chromium oxide, carbide, carbide oxynitride, or any combination of them.

For at least foregoing or other objectives, the invention further provides a method for fabricating a mask, including providing a transparent substrate having a first region, a second region, and a third region. Then, a semi-transparent layer is formed over the transparent substrate at the second region and the third region, wherein the first region of the transparent substrate is exposed. Then, a photoresist layer is formed over the transparent substrate, wherein the photoresist layer covers a portion of the semi-transparent layer within the second region and the first region of the transparent substrate. The semi-transparent layer in the third region is exposed. Then, a film layer is formed over the photoresist layer and the semi-transparent layer. The photoresist layer is removed, wherein the portion of the film layer on the photoresist layer is simultaneously removed while the film layer at the third region remains.

In an embodiment of the invention, the process to form the semi-transparent layer at the second region and the third region of the transparent substrate includes photolithographic and etching processes.

In an embodiment of the invention, the process to form the semi-transparent layer at the second region and the third region of the transparent substrate includes the steps as follows. A first photoresist layer is formed at the first region of the transparent substrate. A semi-transparent material layer is formed over the transparent substrate and the photoresist layer. Then, the photoresist layer is removed, wherein a portion of the semi-transparent material layer on the photoresist layer is simultaneously removed. The remaining portion of the semi-transparent layer is on the second region and the third region.

In an embodiment of the invention, the film layer and the semi-transparent layer are formed from a semi-transparent material. The semi-transparent material can be a phase shift film. Further, the phase shift film can be metal silicide, metal oxide, metal fluoride, metal silicide oxide, metal silicide nitride, metal silicide oxynitride, metal silicide carbide oxide, metal silicide carbide nitride, metal silicide carbide oxynitride, alloy thin film, metal thin film, carbide, carbide oxynitride, or any combination thereof.

In an embodiment of the invention, the film layer can be a light shielding film. The light shielding film can be a black metal film or a black resin film. Further, the black metal film can be chromium, chromium oxide, carbide, carbide oxynitride, or any combination of them.

For at least foregoing or other objectives, the invention further provides a method for fabricating a mask, including providing a transparent substrate having a first region, a second region, and a third region. A first photoresist layer is formed on the transparent substrate at the first region while the second region and the third region of the transparent substrate are exposed. Then, a semi-transparent layer is formed over the transparent substrate and the first photoresist layer. A second photoresist layer is formed over the semi-transparent layer at the first region and the second region while the semi-transparent layer at the third region is exposed. A film layer is formed over the semi-transparent layer and the second photoresist layer. The first photoresist layer and the second photoresist layer are removed, wherein the portion of the semi-transparent layer on the first photoresist layer and the portion of the film layer on the second photoresist layer are simultaneously removed. As a result, the portion of the semi-transparent layer on second region and the portion of both the semi-transparent layer and the film layer at the third region remain while the first region is exposed.

In an embodiment of the invention, the formation of the first photoresist layer and the second photoresist layer are in different conditions of light exposure and developing.

In an embodiment of the invention, the solubility of the first photoresist layer is less than the solubility of the second photoresist layer.

In an embodiment of the invention, the film layer and the semi-transparent layer are formed from a semi-transparent material.

In an embodiment of the invention, the semi-transparent material can be a phase shift film. Further, the phase shift film can be metal silicide, metal oxide. metal fluoride, metal suicide oxide, metal suicide nitride, metal silicide oxynitride, metal silicide carbide oxide, metal silicide carbide nitride, metal silicide carbide oxynitride, alloy thin film, metal thin film, carbide, carbide oxynitride, or any combination thereof.

In an embodiment of the invention, the film layer can be a light shielding film. The light shielding film can be a black metal film or a black resin film. Further, the black metal film can be chromium, chromium oxide, carbide, carbide oxynitride, or any combination of them.

For at least the foregoing and other objectives, the present invention further provides a fabrication process of a liquid crystal display apparatus using the foregoing mask.

In summary, the method for fabricating the mask in the invention is using the lift-off process, so as to reduce the complexity of forming the phase shift mask. In addition, the convention issue of non-uniform thickness of the phase shift film, due to the non-uniform etching elects, can be reduced.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
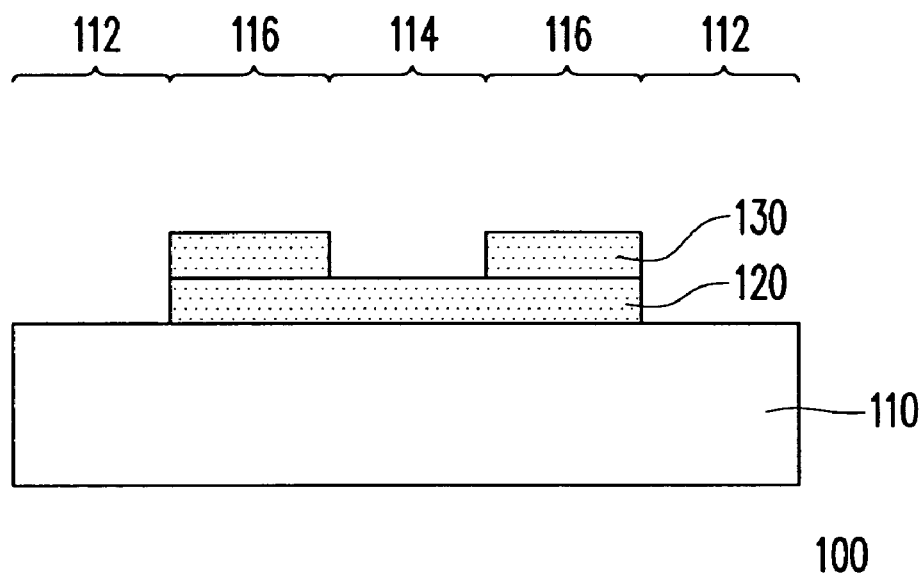
FIG. 1 is a cross-sectional view, schematically illustrating the mask, according to an embodiment of the invention.

FIG. 1 is a cross-sectional view, schematically illustrating a mask, according to an embodiment of the invention. In FIG. 1, the mask 100 of the invention mainly includes a transparent substrate 110, a semi-transparent layer 120, and a film layer 130. The transparent substrate 110 formed from, for example, quartz or other transparent material, is having a first region 112, a second region 114, and a third region 116. The semi-transparent layer 120 covers over the second region 114 and the third region 116 of the transparent substrate 110, and the first region 12 is exposed. The semi-transparent layer 120 is formed from, for example, semi-transparent material. The film layer 130 covers the semi-transparent layer 120 at the third region 116. Since the third region 116 on the transparent substrate 110 is disposed with the semi-transparent layer 120 and the film layer 130, and the second region 114 is only disposed with the semi-transparent layer 120, the light transmittance for the third region 116 is less than the light transmittance for the second region 114. Seeing from the drawing, the first region 112 on the mask 100 is a fully transparent region, the second region 114 is a halftone region, and the third region 116 is a light shielding region. These three regions respectively have different light transmittances.

In the embodiment, both the semi-transparent layer 120 and the film layer 130 can be formed from a semi-transparent material. In this embodiment, the mask with different light transmittances is formed by depositing the semi-transparent material with different thickness at the different regions on the transparent substrate 110. The semi-transparent material is a phase shift film, and the material for the phase shift film can be metal silicide, metal oxide, metal fluoride, metal silicide oxide, metal silicide nitride, metal silicide oxynitride, metal silicide carbide oxide, metal silicide carbide nitride, metal silicide carbide oxynitride, alloy thin film, metal thin film, carbide, carbide oxynitride, or any combination thereof. The mask, formed by using the phase shift film, is a phase shift mask. In addition, the light transmittance at each region of the mask can be adjusted by adjusting the thickness of the semi-transparent layer 120 and the film layer 130 and a proper selection of material. Therefore, the user can take the proper thickness and material for the semi-transparent layer 120 and the film layer 130, according to the actual requirement.

Figure 2:
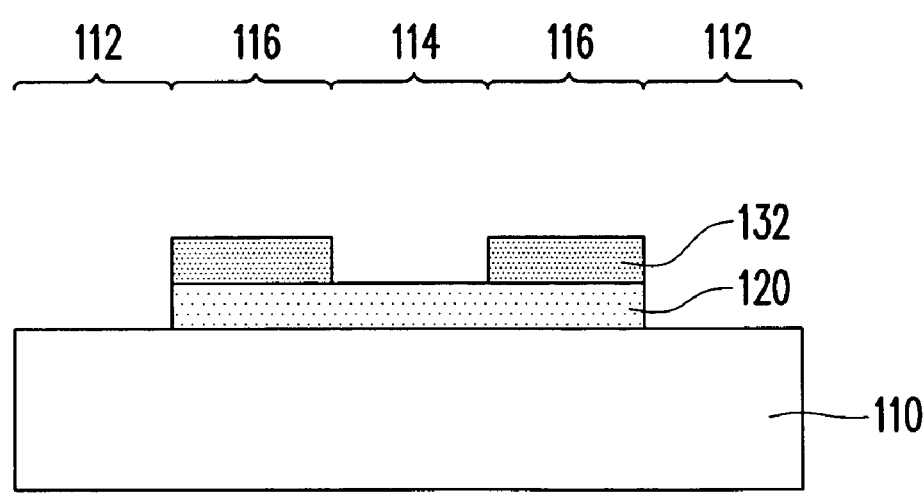
FIG. 2 is a cross-sectional view, schematically illustrating the mask, according to another embodiment of the invention.

In another embodiment, the semitransparent layer 120 and the film layer 130 can be formed by different materials. FIG. 2 is a cross-sectional view, schematically illustrating a mask, according to an embodiment of the invention. In FIG. 2, the semi-transparent layer 120 of the mask 100' is the phase shift film, but the film layer 130, covering the semi-transparent layer 120 at the third region 116, is a light shielding film layer 132. The light shielding thin layer 132 can be a black metal film layer or a black resin layer. Further, the black metal film layer can be chromium, chromium oxide, carbide, carbide oxynitride, or any combination of them.

The foregoing mask 100 can be applied to the fabrication of liquid crystal display apparatus, for example, on fabrication for the gate, the channel region, the source region and the drain region of thin film transistor, electrodes of the capacitor, or the contact; the reflective electrodes for the liquid crystal display apparatus in transflective type or reflective type; the color photoresist pattern or photo spacer of a color filter; or the protrusion of the liquid crystal display apparatus in wide view angle, and so on.

In the following descriptions, several embodiments of fabricating methods for the foregoing mask 100 and mask 100' are described with the drawings.

Figure 3A:
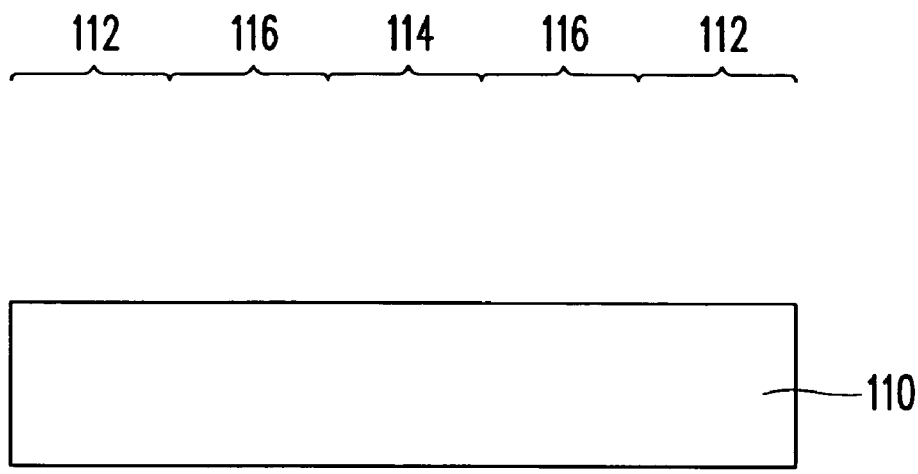
FIGS. 3A-3E are cross-sectional views, schematically illustrating the processes for forming the mask in FIG. 1.
Figure 3B:
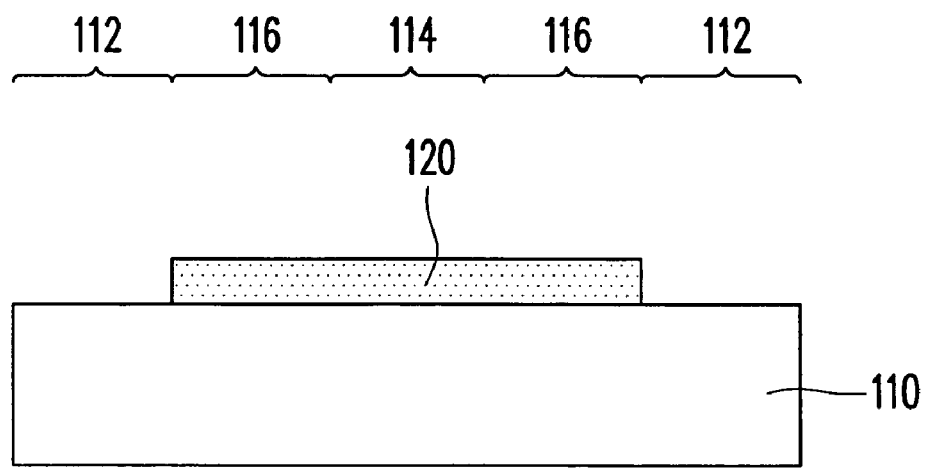

FIGS. 3A-3E are cross-sectional views, schematically illustrating the processes for forming the mask. First, referring to FIG. 3A, a transparent substrate 110 is provided. The transparent substrate 110 has a first region 112, a second region 114, and a third region 116. In addition, the transparent substrate 110 can be, for example, formed from a quartz or other transparent material. Then, as shown in FIG. 3B, a semi-transparent layer 120 is formed on the second region 114 and the third region 116 of The transparent substrate 110, in which the first region 112 of the transparent substrate 110 remains being exposed. In this step, the semi-transparent layer 120 can be formed on the transparent substrate 110 by deposition process, and the photolithographic and etching processes are used to pattern the semi-transparent. The photolithographic process is, for example, using the laser or electron beam to define the photoresist layer, and the etching process is, for example, using the dry etching or wet etching.

Figure 3C:
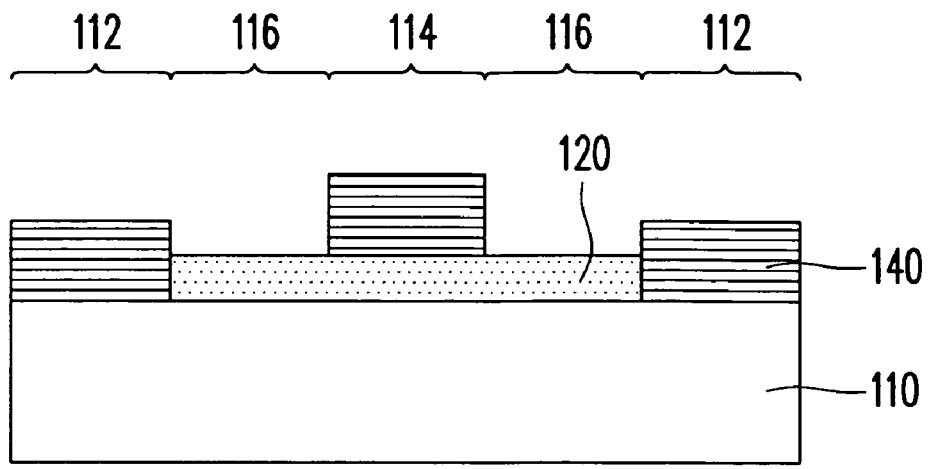
Figure 3D:
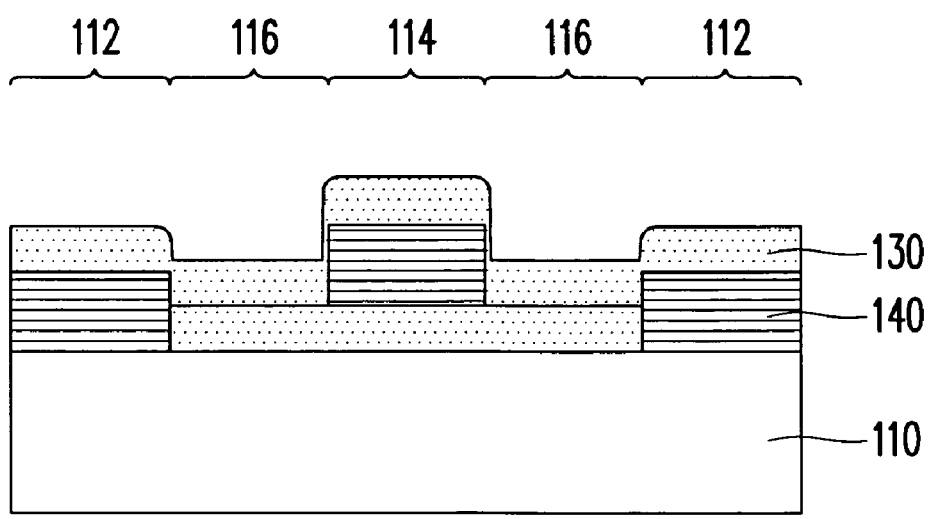
Figure 3E:
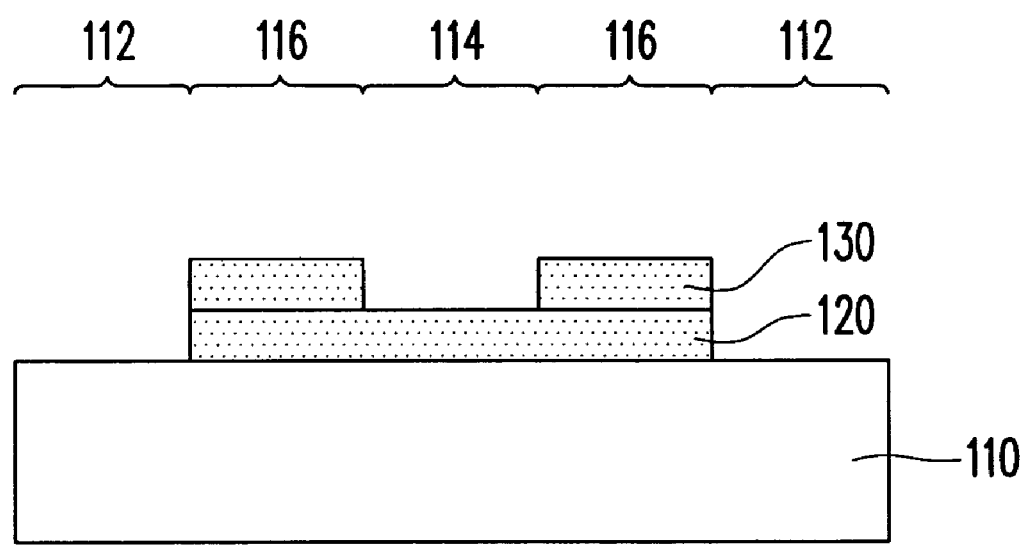

After then, referring to FIG. 3C, a photoresist layer 140 is formed over the transparent substrate 110. This photoresist layer 140 covers the semi-transparent layer 120 Within the second region 114 and the first region 112 of the transparent substrate 110, wherein the semi-transparent layer 120 at the third region 116 is exposed. Next, referring to FIG. 3D, a blanket film layer 130 is formed over the photoresist layer 140 and the semi-transparent layer 120. In FIG. 3E, a lift-off process is performed to remove the photoresist layer 140. At the same time, the portion of the film layer 130 on the photoresist layer 130 is removed, and the remaining portion of the film layer 130 is only on the third region 116. At this stage, the mask 100 is accomplished. The first region 112 on the mask 100 is completely transparent, and the second region 114 is a halftone region, and the third region 116 is a light shielding region.

Here, both the semi-transparent layer 120 and the film layer 130 are formed from a semi-transparent material. The semi-transparent material serves as a phase shift film, and material of the phase shift film call be metal silicide, metal oxide, metal fluoride, metal silicide oxide, metal silicide nitride, metal silicide oxynitride, metal silicide carbide oxide, metal silicide carbide nitride, metal silicide carbide oxynitride, alloy thin film, metal thin film, carbide, carbide oxynitride, or any combination thereof.

In addition, if the foregoing film layer 130 is replaced by the light shielding material, then the structure of the mask is shown in FIG. 2. In other words, the light shielding layer 132 is formed on semi-transparent layer 120. The light shielding layer 132 is a black metal film or a black resin layer. Further, the black metal film can be one of chromium, chromium oxide, carbide, carbide oxynitride and other combination. As a result, by using different materials for forming the semi-transparent layer 120 and the film layer 130, the mask 100' shown in FIG. 2, having the transparent pattern, low transparent pattern, and semi-transparent pattern, can be formed.

Figure 4A:
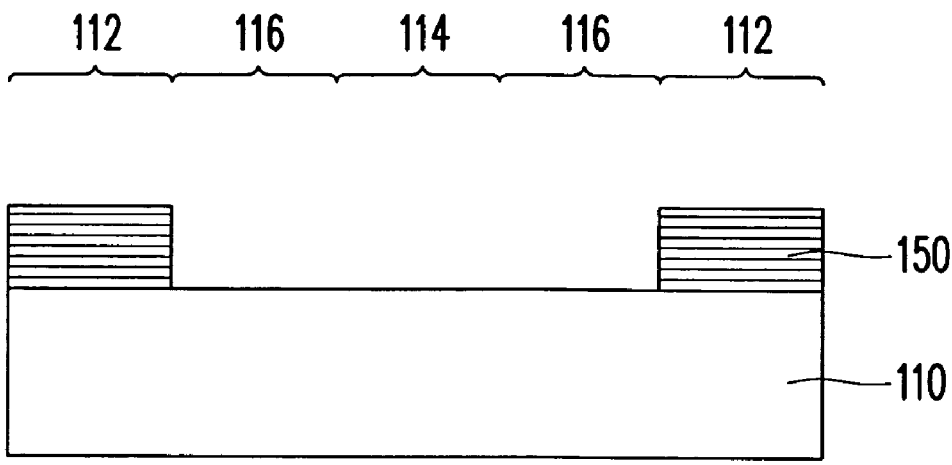
FIGS. 4A-4C are cross-sectional views, schematically illustrating the processes for forming the semi-transparent layer in FIG. 3B by the lift-off process.
Figure 4B:
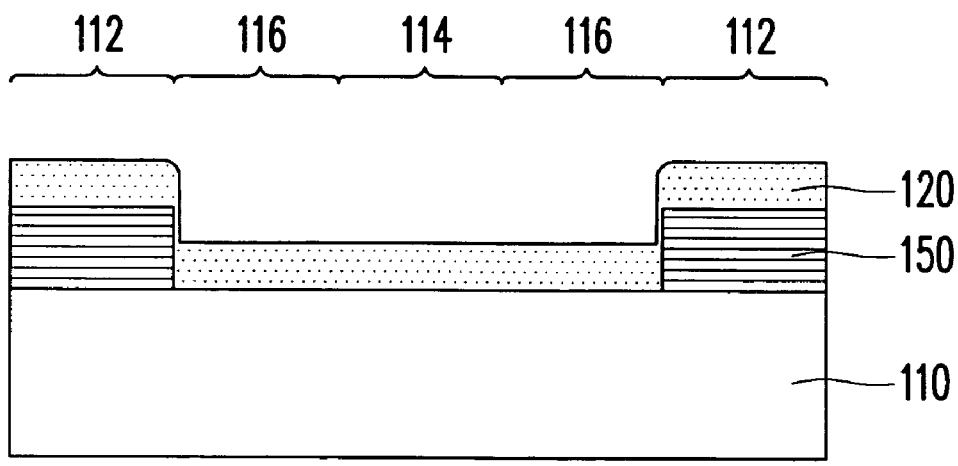
Figure 4C:
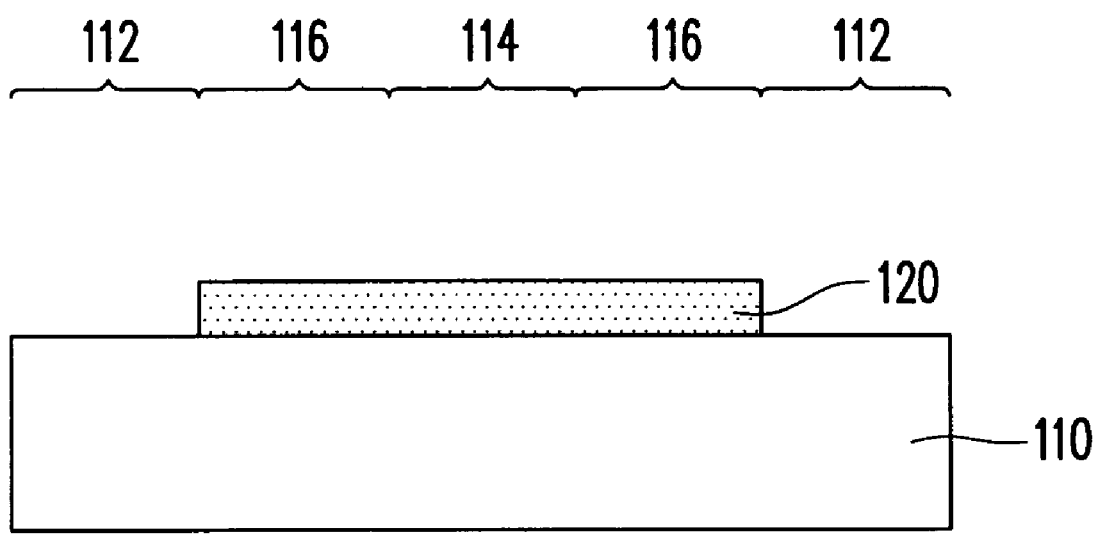

In the foregoing embodiment, the semi-transparent layer 120 shown in FIG. 3B is formed by photolithographic and etching processes. However, the semi-transparent layer 120 can be formed by lift-off process, too. FIGS. 4A-4C are cross-sectional views, schematically illustrating the lift-off process for forming the semi-transparent layer shown in FIG. 3B. First, referring to FIG. 4A, a photolithographic process is performed, for forming a photoresist layer 150 within the first region 112 on the transparent substrate 110. Then, referring to FIG. 4B, a semitransparent layer 120 is formed over the transparent substrate 110 and the photoresist layer 150. In an embodiment of the invention, a photoresist layer 150 With slightly large thickness is coated thereon. Then, the method of a low-temperature collimated sputtering, or a field screen being added with the chemical vapor deposition, and so on, is used to form the semi-transparent layer 120. In this way, it can reduce the requirement of capability of step coverage for the film. This call improve yield for the subsequent process of the lift-off process. Next, as shown in FIG. 4C, the photoresist layer 150 is removed, wherein the portion of the semi-transparent layer 120 on the photoresist layer 150 is simultaneously removed, and the remaining, portion of the semi-transparent layer 120 is on the second region 114 and the third region 116.

Figure 5A:
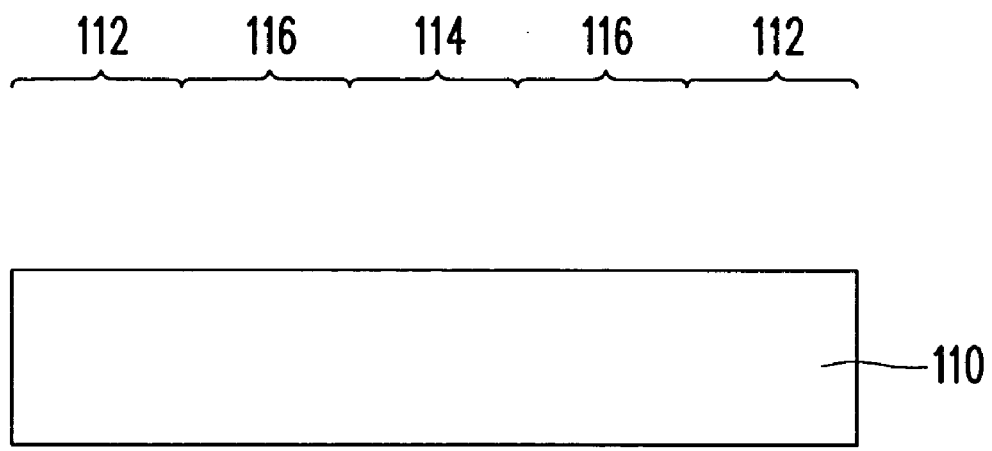
FIGS. 5A-5F are cross-sectional views, schematically illustrating the processes for forming another mask.
Figure 5B:
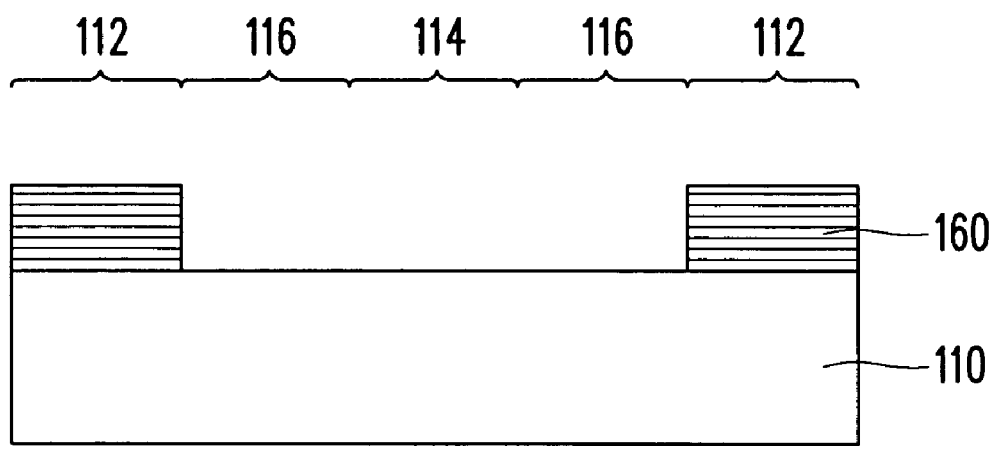
Figure 5C:
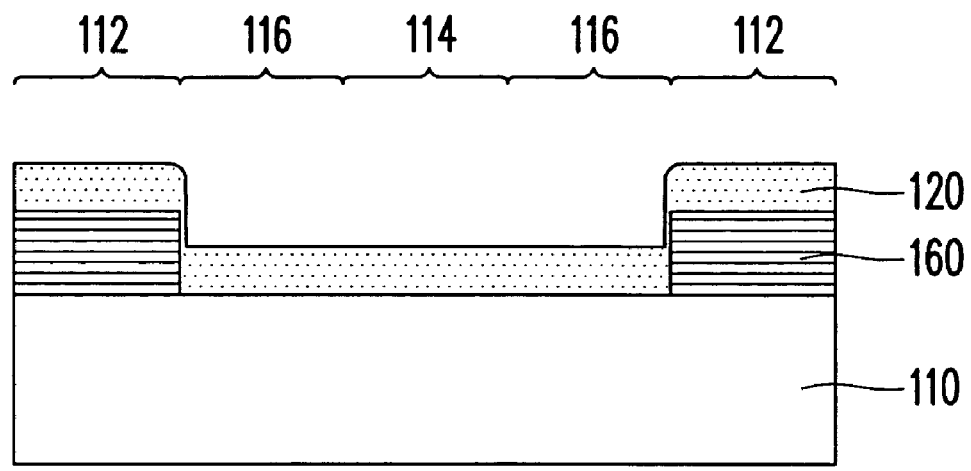

FIGS. 5A-5F are cross-sectional views, schematically illustrating the processes for forming another mask. In FIG. 5A, a transparent substrate 110 is provided. The transparent substrate 110 has a first region 112, a second region 114, and a third region 116. The transparent substrate 110 can be, for example, formed from quartz or other transparent material. In FIG. 5B, a first photoresist layer 160 is formed at the first region 112 of the transparent substrate 110 while the second region 114 and the third region 116 are exposed. In this embodiment, the first photoresist layer 160 can be a colored photoresist layer, so that it is helpful to make the position measurement for the first photoresist layer 160 on the transparent substrate 110. After then, in FIG. 5C, a semi-transparent layer 120 is Formed over the transparent substrate 110 and the first photoresist layer 160. During the foregoing steps, a first photoresist layer 160 with slightly large thickness is coated. Then, when a low temperature collimated sputtering or a chemical vapor deposition is performed, the field screen is, for example, used to form the semi-transparent layer 120.

As a result, the requirement of step cover capability can be reduced, and the yield of the subsequent lift-off process can be improved.

Figure 5D:
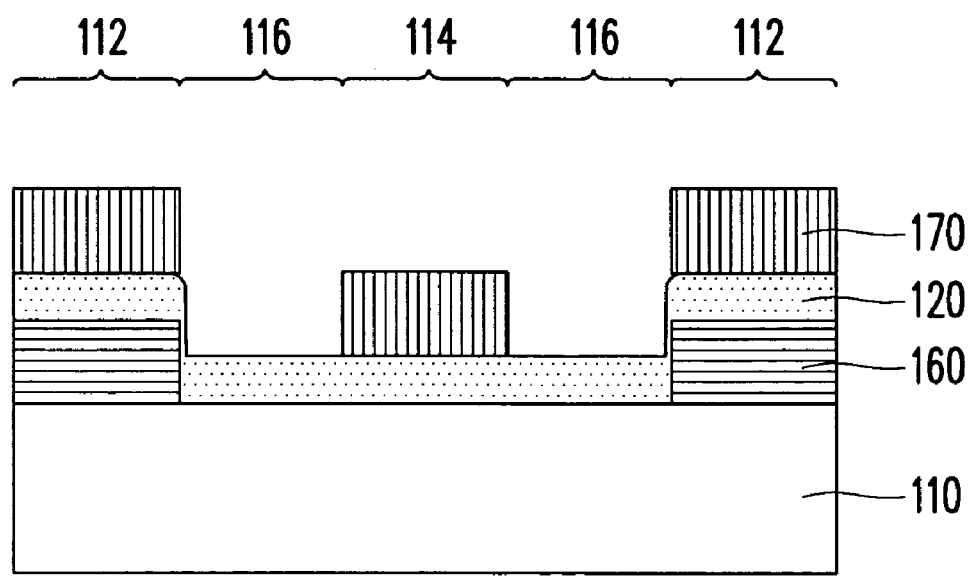
Figure 5E:
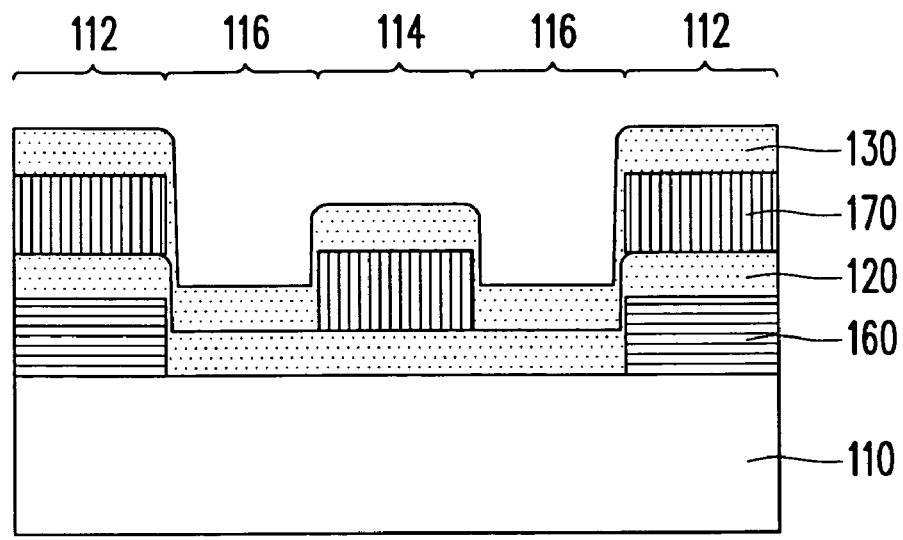
Figure 5F:
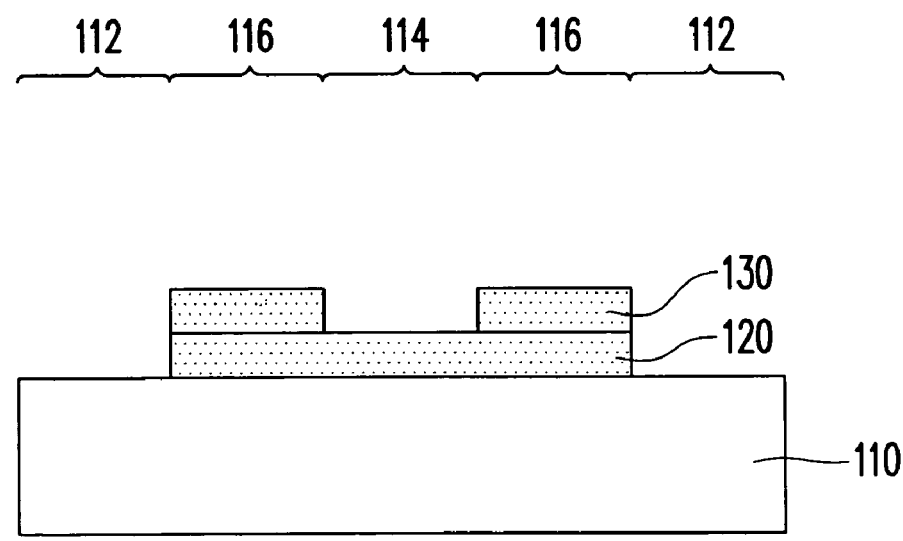

Next, in FIG. 5D, a second photoresist layer 170 is formed over the semi-transparent layer 120 at the first region 112 and the second region 114. The semi-transparent layer 120 at the third region 116 is exposed. In FIG. 5I, a film layer 130 is formed over the semi-transparent layer 120 and the second photoresist layer 170. Similarly, during the processes in FIGS. 5D and 5E, the second photoresist layer 170 with slightly larger thickness is coated, and then the film layer 130 can be formed by adding the field screen when performing a low temperature collimated sputtering or a chemical vapor deposition. As a result, the requirement of the step cover capability can be reduced, and further the yield of the subsequent lift-off process can be improved. In FIG. 5F, the lift-off process is performed to remove the first photoresist layer 160 and the second photoresist layer 170. At the same time, the portion of the semi-transparent layer 120 on the first photoresist layer 160 and the portion of the film layer 130 on the second photoresist layer 170 are simultaneously removed. The portion of the semi-transparent layer 120 at the second region 114 and the portion of the semi-transparent layer 120 and the film layer 130 the third region 116 remain while the first region 112 of the transparent substrate 110 is exposed.

The semi-transparent layer 120 and the film layer 130 in FIGS. 5C-5F can be the same or different materials. The selection of materials is previously described, and is not described again.

In order to prevent the light exposure and developing processes for the second photoresist layer 170 from affecting the intended pattern of the second photoresist layer 160, the materials for the first photoresist layer 160 and the second photoresist layer 170 with different solubility can be selected. For example, the first photoresist layer 160 has less solubility and the second photoresist layer 170 has higher solubility. This can prevent the light exposure and developing processes for the second photoresist layer 170 From simultaneously removing a portion of the first photoresist layer 160. In another embodiment, the first and the second photoresist layer 160 and 170 call use the same material. However, the light exposure and developing processes for the first and the second photoresist layer 160 and 170 are in different condition.

Figure 6A:
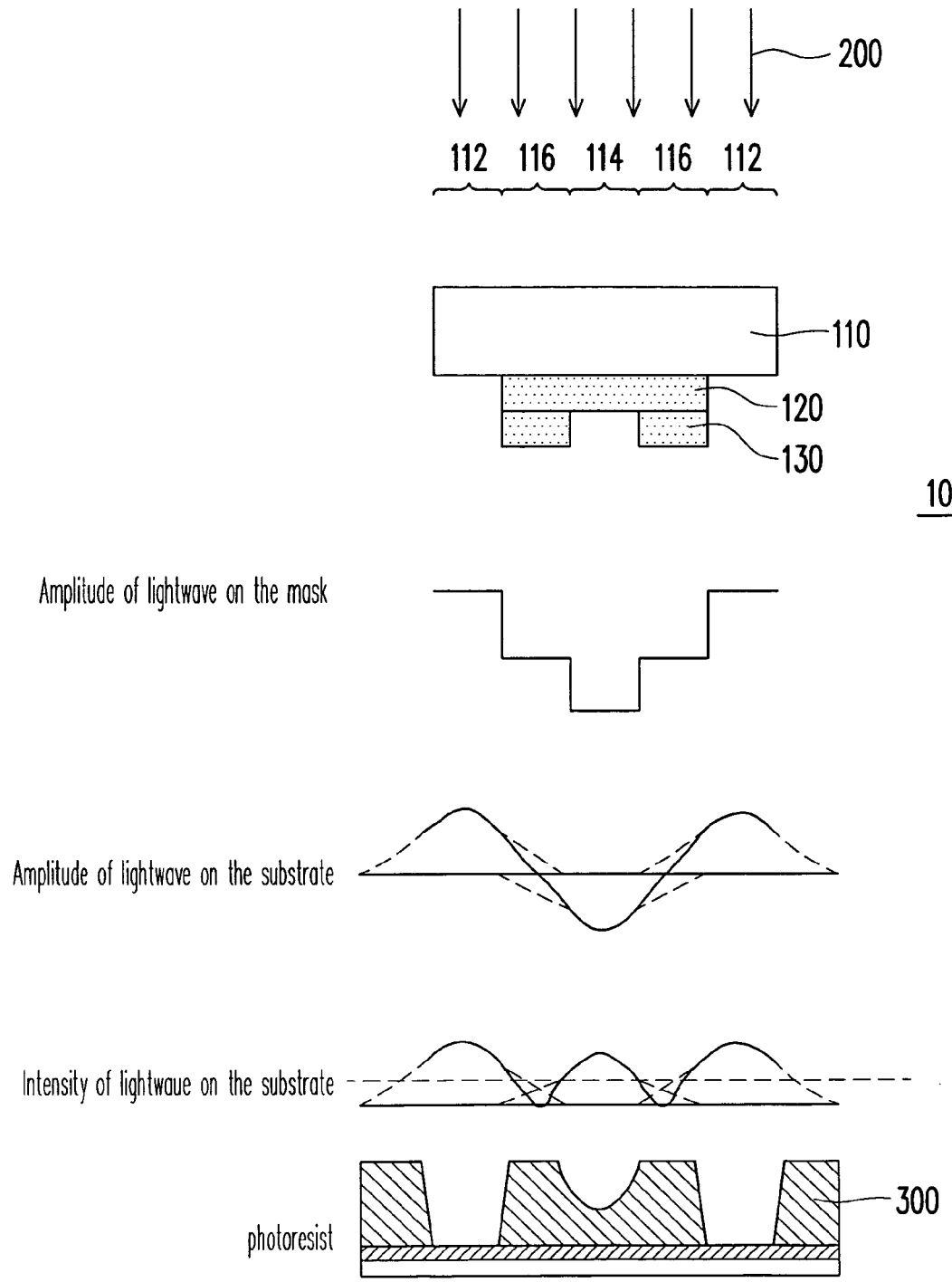
FIG. 6A is a drawing of light intensity of the mask, according to an embodiment of the invention.
Figure 6B:
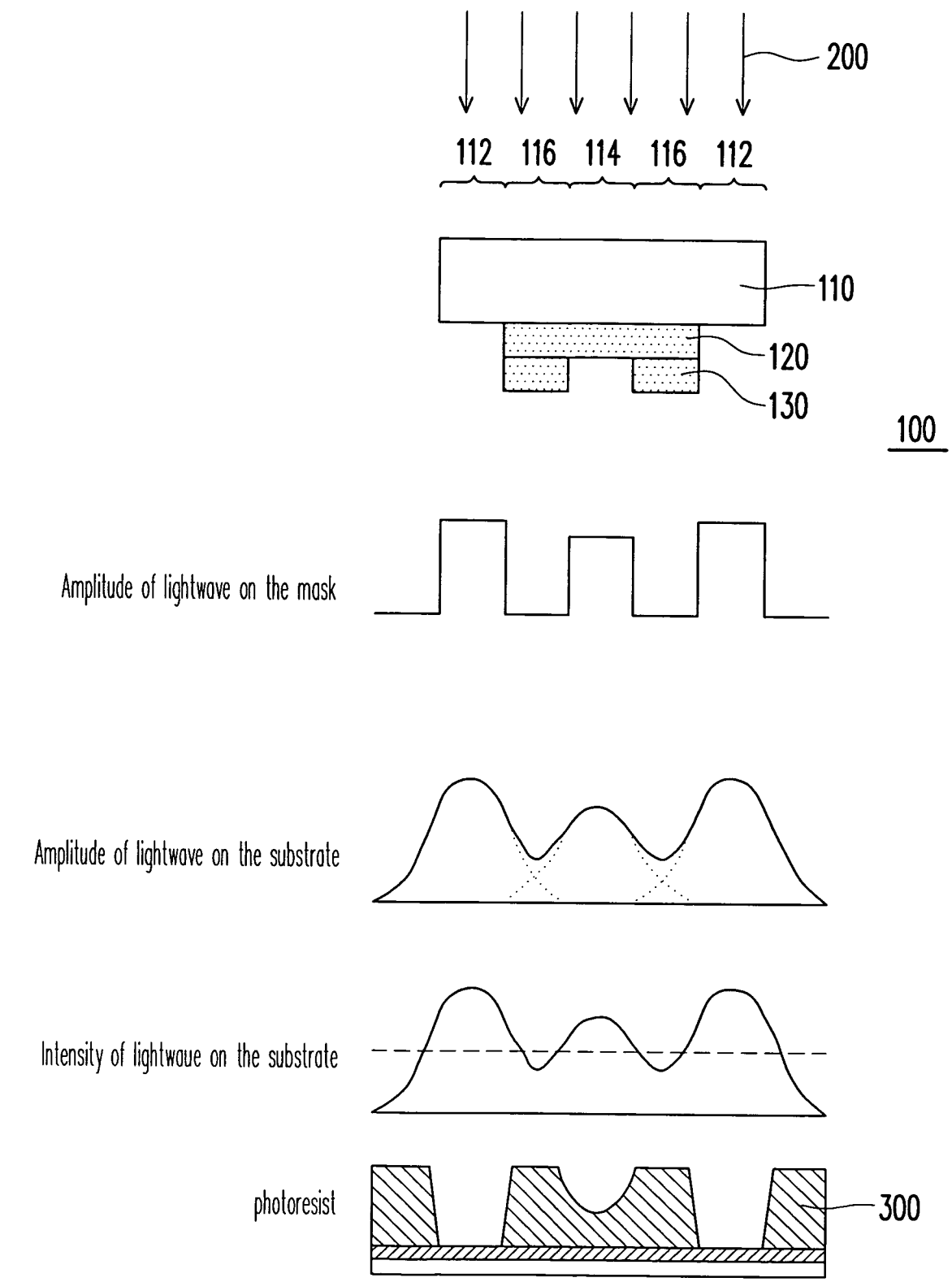
FIG. 6B is a drawing of light intensity of the mask, according to another embodiment of the invention.
Figure 6C:
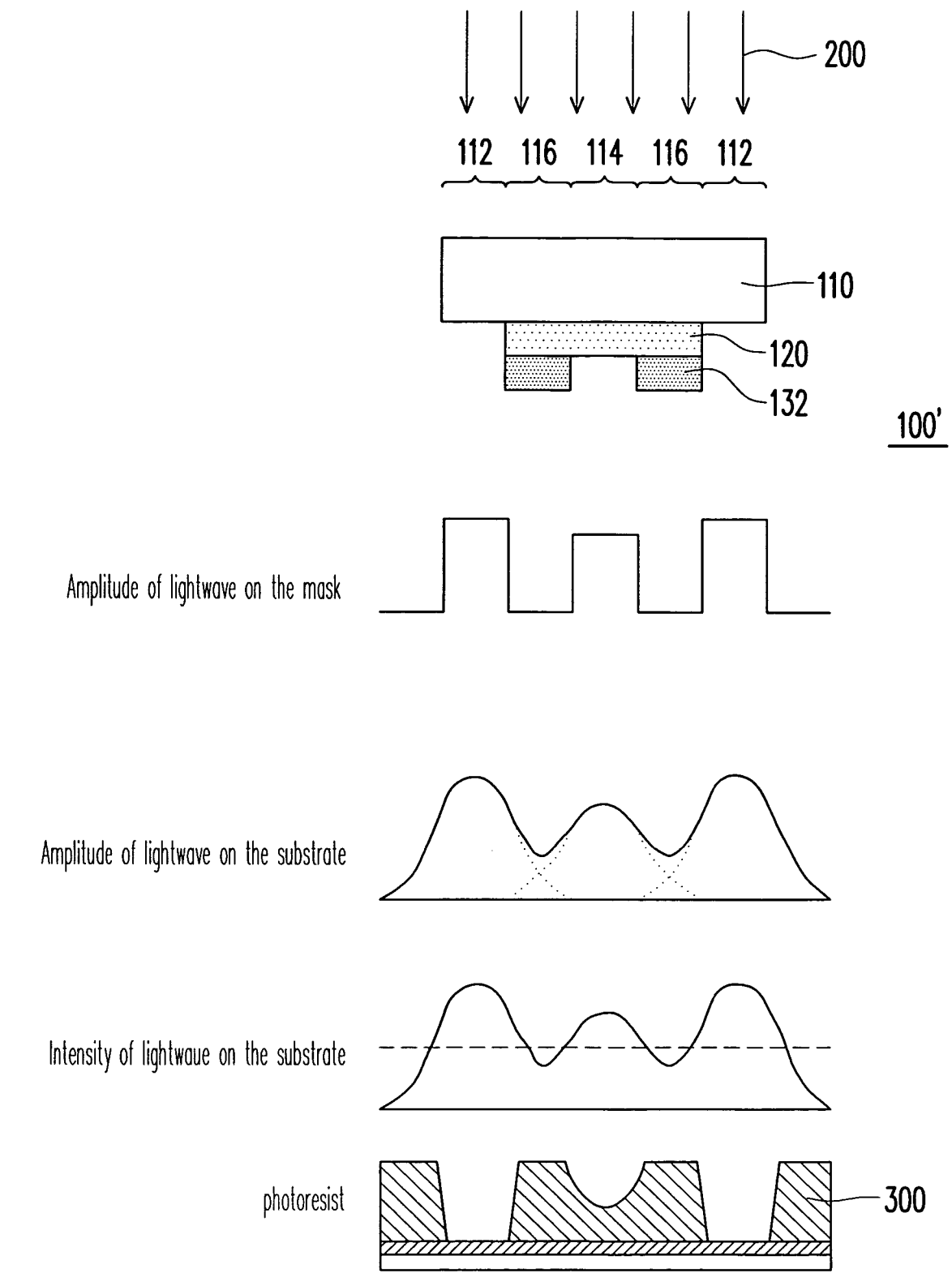
FIG. 6C is a drawing of light intensity of the mask, according to another embodiment of the invention.

FIG. 6A is a drawing of light intensity of the mask, according to an embodiment of the invention. FIG. 6B is a drawing of light intensity of the mask, according to another embodiment of the invention. FIG. 6C is a drawing of light intensity of the mask, according to another embodiment of the invention. In FIGS. 6A-6C, the mask 100 is shown in FIG. 1. The mask 100' is shown in FIG. 2. In addition, the phase shift film in FIG. 6A has the phase angle in a range of $\pi/2 \leq \phi \leq 3\pi/2$. The phase shift film in FIG. 6B has the phase angle in a range of $0 \leq \phi < \pi/2$ and $3\pi/2 < \phi \leq 2\pi$. The phase shift film in FIG. 6B has the phase angle in a range of $\pi/2 \leq \phi \leq 3\pi/2$ and $3\pi/2 < \phi \leq 2\pi$. Since the third region 116 (that is the light shielding region) on the two masks 100 and 100' are respectively deposited with a semi-transparent layer 120 and a light shielding layer 132, the light transmittance is relatively less. As a result, the waveform of the incident light 200 at the second region 114 interferences with the waveform of the incident light 200 at the third region 116. As shown at bottom in FIGS. 6A-6C, the profiles of the photoresist layer 130 are obtained after using the masks 100 and 100' for light exposure and developing processes. Particularly, the film thickness at the third region 116 of the mask 100 in FIG. 6A, would affect the phase angle, so as to produce the different interference waveform. Thus, the user can adjust the thickness of the phase shift film, according to the actual need, in considering the use of proper material for the photoresist material and the fabrication parameters. As a result, the intended pattern and the line width can be obtained.

In summary, the invention at least has the advantages as follows.

The invention use the lift-off process for fabricating, the mask, the process for forming the phase shift mask can be reduced. This can reduce the occurrence of defect or non-uniform transmittance due to etching process. The cost for producing the phase shift mask can be therefore reduced.

In comparing with the conventional manner about using the etching process to remove a portion of the phase shift film for the phase shift mask, the invention uses the lift-off process to form the mask and therefore can prevent the non-uniform thickness of the phase shift film due to non-uniform etching from occurring. Therefore, by just controlling the thickness of the phase shift film, the phase shift mask with improvement of uniform transmittance and uniform phase angle for the phase shift film can be obtained. The yield for fabrication process in production line can be further improved.

The invention provides a simple fabrication process for forming the mask. This fabrication process can be widely used in photolithographic process for fabricating the display, the color filter, the semiconductor device without increasing additional equipment, so as to reduce the process for forming the array of the liquid crystal display and reduce the cost. At the same time, the shape of the photoresist pattern can be improved, and the panel uniformity can be improved. Occurrence of the color non-uniformity, that is, mura can be reduced.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A method for fabricating a mask, comprising:
   providing a transparent substrate, having a first region, a second region, and a third region;
   forming a semi-transparent layer on the transparent substrate at the second region and the third region, and the first region of the transparent substrate being exposed;
   forming a photoresist layer over the transparent substrate, wherein the photoresist layer covers the semi-transparent layer at the second region and the transparent substrate at the first region, and the semi-transparent layer at the third region is exposed;
   forming a film layer over the photoresist layer and the semi-transparent layer; and
   removing the photoresist layer, wherein a portion of the film layer on the photoresist layer is simultaneously removed and a portion of the film layer at the third region remains.

2. The method of claim 1, wherein the step of forming the semi-transparent layer on the transparent substrate at the second region and the third region comprises photolithographic and etching processes.

3. The method of claim 1, wherein the step of forming the semi-transparent layer on the transparent substrate at the second region and the third region comprises:
   forming a photoresist layer over the transparent substrate at the first region;

forming the semi-transparent layer over the transparent substrate and the photoresist layer; and removing the photoresist layer, wherein a portion of the semi-transparent layer on the photoresist layer is simultaneously removed, and a portion of the semi-transparent layer at the second region and the third region remains.

4. The method of claim 1, wherein the film layer and the semi-transparent layer are formed from a semi-transparent material.

5. The method of claim 4, wherein the semi-transparent material is a phase shift film, and the phase shift film is one selected from the group consisting of metal silicide, metal oxide, metal fluoride, metal silicide oxide, metal silicide nitride, metal silicide oxynitride, metal silicide carbide oxide, metal silicide carbide nitride, metal silicide carbide oxynitride, alloy thin film, metal thin film, carbide, carbide oxynitride, and any combination thereof.

6. The method of claim 1, wherein the film layer is a light shielding film.

7. The method of claim 6, wherein the light shielding film is a black metal film or a black resin film.

8. The method of claim 7, wherein the black metal film is chromium, chromium oxide, carbide, carbide oxynitride, or any combination thereof.

9. A method for fabricating a mask, comprising:
providing a transparent substrate, having a first region, a second region, and a third region;
forming a first photoresist layer over the transparent substrate at the first region, and the second region and the third region of the transparent substrate being exposed;
forming a semi-transparent layer over the transparent substrate and the first photoresist layer;
forming a second photoresist layer over the semi-transparent layer at the first region and the second region, and the semi-transparent layer at third region being exposed;
forming a film layer over the semi-transparent layer and the second photoresist layer; and
removing the first photoresist layer and the second photoresist layer, wherein a portion of the semi-transparent layer on the first photoresist layer and a portion of the film layer on the second photoresist layer are simultaneously removed, and a portion of the semi-transparent layer at the second region and portions of the semi-transparent layer with the film layer at the third region remain, wherein the first region is exposed.

10. The method of claim 9, wherein the first photoresist layer and the second photoresist layer are formed by different conditions of light exposure and developing processes.

11. The method of claim 9, wherein a solubility of the first photoresist layer is less than a solubility of the second photoresist layer.

12. The method of claim 9, wherein the film layer and the semi-transparent layer are formed from a semi-transparent material.

13. The method of claim 12, wherein the semi-transparent material is a phase shift film, and the phase shift film is one selected from the group consisting of metal silicide, metal oxide, metal fluoride, metal silicide oxide, metal silicide nitride, metal silicide oxynitride, metal silicide carbide oxide, metal silicide carbide nitride, metal silicide carbide oxynitride, alloy thin film, metal thin film, carbide, carbide oxynitride, and any combination thereof.

14. The method of claim 9, wherein the film layer is a light shielding film.

15. The method of claim 14, wherein the light shielding film is a black metal film or a black resin film.

16. The method of claim 15, wherein the black metal film is chromium, chromium oxide, carbide, carbide oxynitride, or any combination thereof.

* * * * *